(12) United States Patent
Lee et al.

(10) Patent No.: US 7,642,187 B2
(45) Date of Patent: Jan. 5, 2010

(54) METHOD OF FORMING WIRING OF A SEMICONDUCTOR MEMORY DEVICE

(75) Inventors: Sang-Hyun Lee, Suwon-si (KR); Min-Soo Kim, Seoul (KR); Tae-Hoon Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/905,397

(22) Filed: Sep. 28, 2007

(65) Prior Publication Data
US 2008/0146027 A1 Jun. 19, 2008

(30) Foreign Application Priority Data
Sep. 28, 2006 (KR) .................. 10-2006-0094646

(51) Int. Cl.
*H01L 21/44* (2006.01)
(52) U.S. Cl. .................. 438/653; 438/231; 438/238; 438/623; 438/631; 438/648; 257/E21.162; 257/E21.165
(58) Field of Classification Search .................. None
See application file for complete search history.

(56) References Cited

U.S. PATENT DOCUMENTS

| | | | |
|---|---|---|---|
| 5,272,110 A | 12/1993 | Koyama | |
| 5,470,792 A | 11/1995 | Yamada | |
| 5,472,890 A * | 12/1995 | Oda | 438/305 |
| 5,702,983 A | 12/1997 | Shinohara | |
| 5,838,409 A * | 11/1998 | Tomono et al. | 349/122 |
| 5,973,402 A | 10/1999 | Shinriki et al. | |
| 6,097,094 A * | 8/2000 | Ishigami | 257/763 |
| 6,962,877 B2 | 11/2005 | Lee | |
| 2005/0242402 A1 | 11/2005 | Ohkawa | |

* cited by examiner

*Primary Examiner*—N Drew Richards
*Assistant Examiner*—Kyoung Lee
(74) *Attorney, Agent, or Firm*—Lee & Morse, P.C.

(57) ABSTRACT

A method of forming a wiring for a semiconductor memory device includes obtaining a semiconductor substrate, depositing at least one conductive layer on the semiconductor substrate under controlled conditions, such as substrate temperature and atmosphere temperature, to provide a conductive layer exhibiting a reduced surface roughness as compared to a comparable conductive layer deposited under uncontrolled conditions, and patterning the conductive layer to form a wiring.

13 Claims, 8 Drawing Sheets

METHOD OF FORMING WIRING OF A SEMICONDUCTOR MEMORY DEVICE

BACKGROUND OF THE INVENTION

1. Field of the Invention

Embodiments of the present invention relate to a method of forming a semiconductor memory device. In particular, embodiments of the present invention relate to a method of forming improved wiring of a semiconductor memory device.

2. Description of the Related Art

The recent growth of information and communication technologies, e.g., computer industry, has triggered an increased development of semiconductor memory devices, thereby providing highly integrated semiconductor memory devices with improved speed and storage capacity. An increased integration of semiconductor devices may require a decreased design rule and, accordingly, provide reduced distances between circuit elements and reduced margins, which may result in misaligned elements, thereby reducing reliability and yield of the semiconductor memory device. Accordingly, attempts have been made to form multi-layered wiring structures, i.e., a plurality of vertically interconnected metal wiring layers, in order to overcome manufacturing difficulties due to the decreased design rule.

For example, a conventional multi-layered wiring structure may include two wiring layers with an insulation layer therebetween and a via hole through the insulation layer. However, it may be difficult to form a smooth wiring layer, i.e., a conductive layer exhibiting a relatively low surface roughness, thereby causing formation of a non-uniform photosensitive layer thereon. In other words, when a conductive layer includes a surface with a plurality of vertical irregularities, i.e., minute vertical height variations in a form of crests/indents, the photosensitive layer on the conductive layer may be thicker in regions corresponding to indents between the crests.

Light irradiated through the photosensitive layer toward the conductive layer may not be able to reach the conductive layer through thicker portions of the photosensitive layer, thereby forming defected patterns, i.e., unwanted portions of the photosensitive layer may remain unetched. Further, due to non-uniform thickness of the photosensitive material and patterning thereof, etching of the conductive layer may be non-uniform, thereby forming defective wiring, e.g., undesired profile, bridging between adjacent wirings, and so forth. Accordingly, there exists a need for a method of fabricating a semiconductor memory device having wiring layers with smooth surfaces.

SUMMARY OF THE INVENTION

Embodiments of the present invention are therefore directed to a method of fabricating a wiring of semiconductor memory device, which substantially overcomes one or more of the problems due to the limitations and disadvantages of the related art.

It is therefore a feature of an embodiment of the present invention to provide a method of fabricating a semiconductor memory device wiring having a reduced surface roughness.

It is another feature of an embodiment of the present invention to provide a method of fabricating a wiring for a semiconductor memory device capable of reducing bridging between adjacent wiring.

At least one of the above and other features of the present invention may be realized by providing a method of forming a wiring for a semiconductor memory device, including depositing a metal underlayer film on a semiconductor substrate having at least one circuit element, depositing a conductive layer on the metal underlayer film to form a conductive layer having a substantially uniform surface profile, and patterning the metal underlayer film and the conductive layer to form a wiring.

Depositing the metal underlayer film may include depositing titanium. Depositing the conductive layer may include depositing aluminum. The titanium may be deposited to a thickness of about 100 to about 150 angstroms. The aluminum may be deposited to a thickness of about 1700 to about 6000 angstroms. Depositing the metal underlayer film may include depositing titanium to a thickness sufficient to prevent formation of titanium aluminide between the metal underlayer film and the conductive layer. Depositing the conductive layer on titanium may include forming an aluminum layer exhibiting lower surface roughness than a comparable aluminum layer deposited on TiN or Ti/TiN.

At least one of the above and other features of the present invention may be further realized by providing a method of forming a wiring for a semiconductor memory device, including obtaining a semiconductor substrate having at least one circuit element, depositing at least one conductive layer on the semiconductor substrate in a state in which a temperature of the semiconductor substrate and an atmosphere temperature are controlled, such that the conductive layer exhibits a lower surface roughness than a comparable conductive layer deposited in a state in which a temperature of a semiconductor substrate and an atmosphere temperature are uncontrolled, and patterning the conductive layer to form a wiring. Depositing the conductive layer may include depositing aluminum.

The controlled temperature of the semiconductor substrate may be within a range of about 20° C. to about 100° C. The controlled atmosphere temperature may be within a range of about 0° C. to about 200° C. More specifically, the controlled atmosphere temperature may be within a range of about 100° C. to about 200° C.

Further, the method may additionally include depositing a metal underlayer film between the conductive layer and the semiconductor substrate. Depositing the metal underlayer film may include depositing titanium.

The method may further include depositing a plurality of conductive layers on the semiconductor substrate. The method may also include depositing a plurality of metal underlayer films on the semiconductor substrate, each metal underlayer film being in communication with a respective conductive layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0094646, filed on Sep. 28, 2006 in the Korean Intellectual Property Office and entitled: "Method of Forming the Wiring of the Semiconductor Memory Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An exemplary embodiment of a method of fabricating a semiconductor device, e.g., a DRAM, of the present invention will now be more fully described with respect to FIGS. 1A-1D.

Figure 1A:
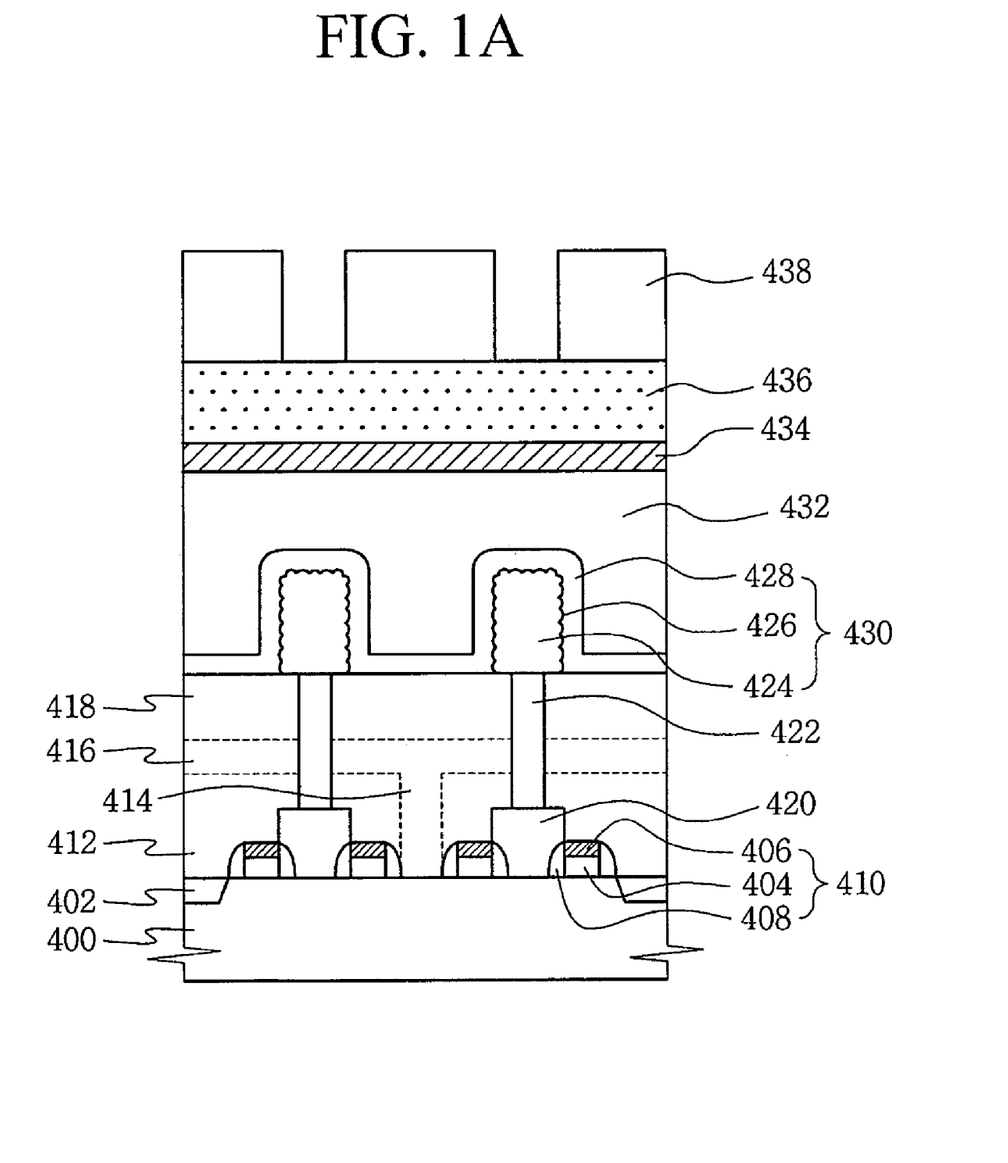
FIGS. 1A-1D illustrate cross sectional views of sequential steps in a method of fabricating a wiring structure for a semiconductor memory device according to an exemplary embodiment of the present invention.

First, referring to FIG. 1A, at least one gate electrode 410 may be formed on a semiconductor substrate 400, where an active region and a field region are separated by a trench isolation 402. The semiconductor substrate 400 may include a plurality of circuit patterns (not shown), e.g., transistors, bit lines, capacitors, and so forth. The gate electrode 410 may be formed by depositing and patterning a polysilicon layer 404 on the substrate 400, depositing and patterning a silicide layer 406, e.g., a layer of tungsten silicide (WSi), on the polysilicon layer 404, and forming a gate spacer 408 on the substrate 400 and in communication with side walls of the polysilicon layer 404 and the silicide layer 406. The gate spacer 408 may be formed, e.g., of a nitride layer (SiN), in order to improve electrical properties of the gate electrode 410.

Once the gate electrode 410 is complete, impurities may be implanted into the semiconductor substrate 400 by using the gate electrode 410 as a self-aligned mask. More specifically, Group 3B elements, e.g., boron (B), or Group 5B elements, e.g., phosphor (P) and/or arsenic (As), may be ion implanted into the semiconductor substrate 400 to form source/drain regions (not shown) adjacent to the gate electrode 410.

Subsequently, a first interlayer insulating layer 412 may be formed on the semiconductor substrate 400 to coat an upper surface of the at least one gate electrode 410 and source/drain regions adjacent thereto. An upper surface, i.e., a surface not in contact with the semiconductor substrate 400, of the first interlayer insulating layer 412 may be flattened by an etch-back process or a chemical mechanical polishing. The first interlayer insulating layer 412 may be formed of a high density plasma oxide by a chemical vapor deposition in order to minimize diffusion of impurities away from the source/drain regions during a subsequent heat treatment and to minimize deformation of the profile of the first interlayer insulating layer 412 during a chemical process.

Once the first interlayer insulating layer 412 is formed and flattened, a direct contact hole may be formed, e.g., by a photo etching process, therethrough to extend to the drain region. The resultant direct contact hole may be treated to remove potential impurities or a natural oxidation film. A conductive material, e.g., tungsten (W), may be deposited into the direct contact hole to form a direct contact 414, so that a bit line 416 may be formed on the first interlayer insulating layer 412, and may be electrically connected to the drain region through the direct contact 414. The bit line 416 may be formed by sequentially depositing a titanium silicide layer, a barrier layer of titanium nitride, a tungsten layer and a nitride layer on the first interlayer insulating layer 412, followed by using the nitride layer as an etching mask to pattern the tungsten layer, the titanium nitride layer and the titanium silicide layer. Formation of the bit line 416 according to an embodiment of the present invention may increase speed of the semiconductor memory device.

Next, a second interlayer insulating layer 418 may be formed on the semiconductor substrate 400 by depositing a high density plasma oxide, e.g., ozone tetra ethyl ortho-silicate ($O_3$-TEOS), boron phosphosilicate glass (BPSG), spin-on-glass (SOG), and so forth, onto the bit line 416, while the bit line 416 may be maintained at a low temperature. The upper surface of the second interlayer insulating layer 418 may be flattened by an etch-back process or a chemical polishing process.

Once the second interlayer insulating layer 418 is formed and flattened, a buried contact hole may be formed to extend therethrough, through the bit line 416, and through an upper portion of the first interlayer insulating layer 412, i.e., between the upper surface of the second interlayer insulating layer 418 and the source region. A buried contact 422 may be formed therein by filling a conductive material into the buried contact hole. The buried contact 422 may be connected to a landing pad 420 formed on the source region in order to achieve an arrangement margin.

Next, at least one capacitor 430 may be formed on the second interlayer insulating layer 418, and may be electrically connected to the buried contact 422. The capacitor 430 may be formed of a lower electrode 424, a high dielectric layer 426 and an upper electrode 428. The lower electrode 424 of the capacitor 430 may be formed of polysilicon in a rounded, e.g., cylindrical, shape in order to increase its capacitance, and may be formed in a hemispherical grain (HSG) shape. The high dielectric layer 426 of the capacitor 430 may be formed on the lower electrode 424 of, e.g., tantalum oxide ($Ta_2O_5$), aluminum oxide ($Al_2O_3$), and so forth, by an atomic layer deposition, or of a laminated structure of oxide/nitride/oxide (ONO). The upper electrode 428 of the capacitor 430 may be formed of, e.g., a polysilicon layer or a double layer consisting of a titanium nitride layer and a polysilicon layer, on the high dielectric layer 426.

Next, a third interlayer insulating layer 432 may be formed on the semiconductor substrate 400 to cover the capacitor 430. The third interlayer insulating layer 432 may include $O_3$-TEOS, BPSG, or SOG. A first metal underlayer 434 and a first conductive layer 436 may be sequentially deposited on the third interlayer insulating layer 432, followed by formation of a photosensitive pattern 438 on the first conductive layer 436.

More specifically, the first metal underlayer 434 may be formed by depositing a titanium (Ti) layer to a predetermined thickness of about 100 to about 150 angstroms on an upper surface of the third interlayer insulating layer 432. Use of titanium as a metal underlayer between the first conductive layer 436 and the semiconductor substrate 400 may be beneficial to form the first conductive layer 436 with a substantially uniform surface profile. A thickness of the metal underlayer 434 above about 150 angstroms may trigger formation of a high resistance barrier, e.g., a titanium aluminide (TiAlx) layer, between the first metal underlayer 434 and the first conductive layer 436 and, thereby, reduce reliability of the semiconductor memory device. On the other hand, a thickness of the metal underlayer 434 below about 100 angstroms may be insufficient to improve the surface roughness of the first conductive layer 436.

The first conductive layer 436 may be deposited on the metal underlayer 434 to a thickness of about 1700 to about 6000 angstroms. The first conductive layer may include aluminum. The temperature conditions during deposition of the first conductive layer 436, i.e., a temperature of the semiconductor substrate 400 and/or a temperature of atmosphere, may be controlled to provide a substantially uniform surface profile of the first conductive layer 436. In other words, a surface roughness of the first conductive layer 436 may be lower than a surface roughness of a comparable conductive layer deposited under uncontrolled temperature conditions, i.e., uncontrolled temperatures of a substrate and/or atmosphere. More specifically, the temperature of the semiconductor substrate 400 may be about 20° C. to about 100° C., as will be discussed in more detail below with respect to FIG. 3. The atmosphere temperature may be below about 200° C., and preferably about 100° C. to about 200° C., as will be discussed in more detail below with respect to FIGS. 4-6.

In this respect, it is noted that a "comparable conductive layer" or a "comparable aluminum layer" refers to a conductive layer including a substantially similar chemical composition and thickness, and formed on a same surface as the first conductive layer 436. It is also noted that a "substantially uniform surface profile" refers to a surface of a layer exhibiting a low average roughness number with respect to a surface roughness of an aluminum deposited on titanium nitride (TiN) or titanium/titanium nitride (Ti/TiN). It is further noted that "roughness" may be measured in units of angstroms by using, e.g., a MetaPulse system made by Rudolph Technologies, Inc.

Figure 1B:
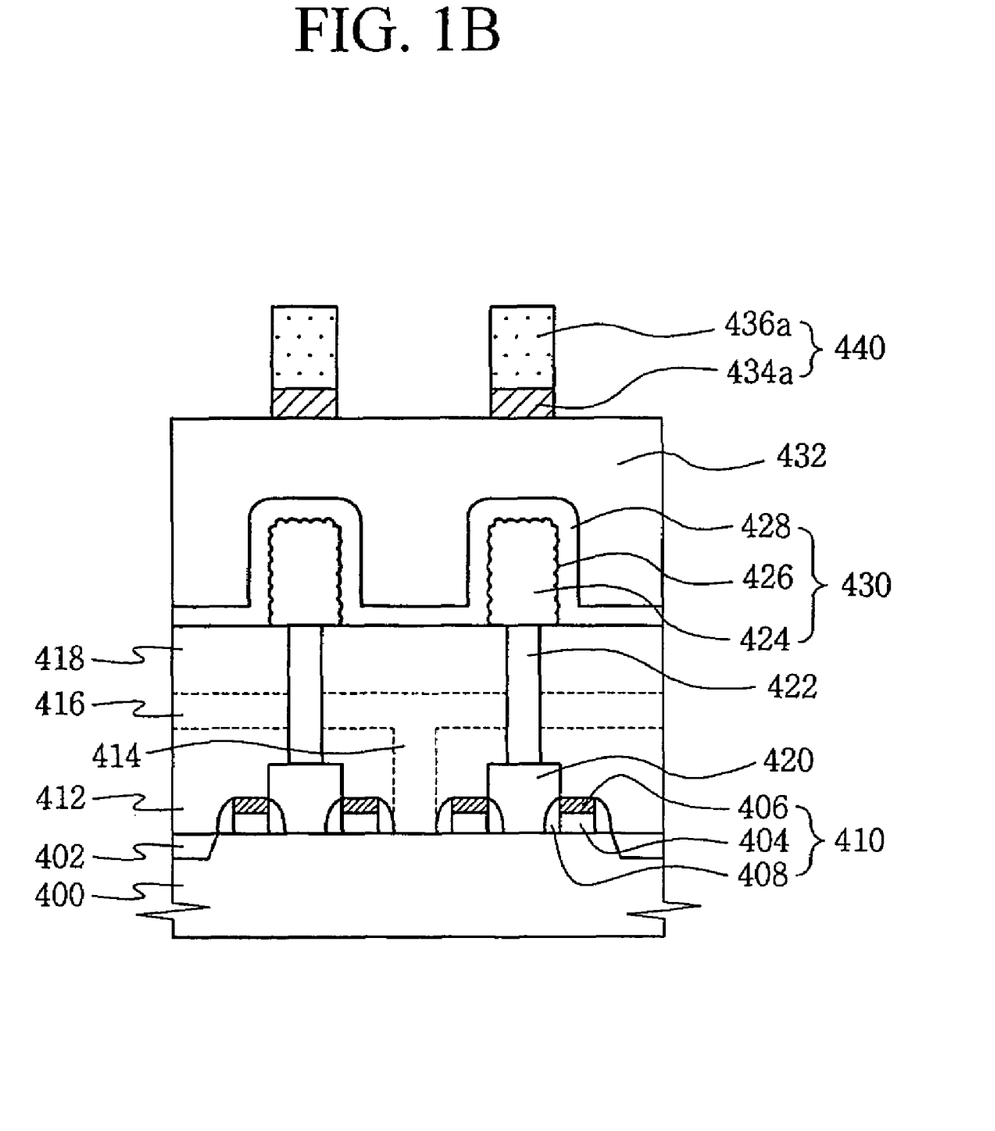

Once the first conductive layer 436 and the first metal underlayer 434 are deposited, the photosensitive pattern 438 may be used as an etching mask to etch the first conductive layer 436 and the first metal underlayer 434 into a first conductive pattern 436a and a first metal pattern 434a via, e.g., a plasma etching process, to form a lower metal wiring 440, as illustrated in FIG. 1B.

The plasma etching process may be performed as follows. The semiconductor substrate 400 having the first conductive layer 436 thereon may be disposed in a process chamber with a decoupled plasma source (DPS). Next, process gases may be injected into the process chamber. For example, a mixture of about 120 sccm of boron trichloride ($BCl_3$), about 60 sccm of chloride ($Cl_2$), about 10 sccm of trifluoromethane ($CHF_3$), about 10 sccm of nitrogen ($N_2$) and about 100 sccm of argon (Ar) may be used for plasma etching of the first conductive layer 436 and the first metal underlayer 434. The process chamber may be maintained at a RF power of about 1000 Watt, pressure of about 8 to about 20 mT, and temperature of about 0 to about 150° C. Plasma etching may be performed in the process chamber for about 100 seconds to about 150 seconds to facilitate a chemical reaction between the process gases and portions of the first conductive layer 436 not covered by the photosensitive pattern 438.

Figure 1C:
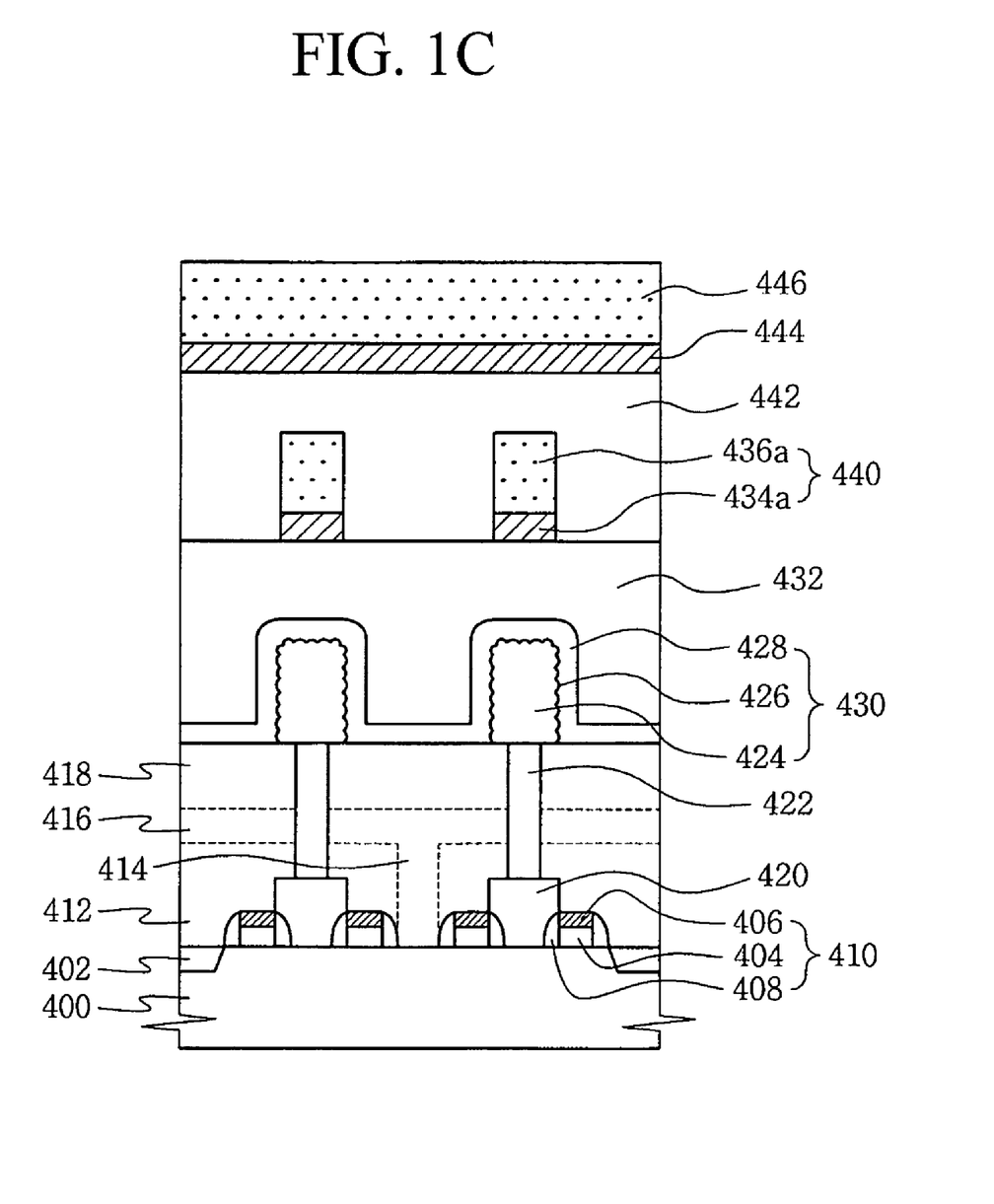

As illustrated in FIG. 1C, a fourth interlayer insulating layer 442 may be deposited and flattened on the substrate 400 to cover the lower metal wiring 440. Next, a second metal underlayer 444 and a second conductive layer 446 may be sequentially deposited onto an upper surface of the fourth interlayer insulating layer 442. The second metal underlayer 444 and second conductive layer 446 may be identical to the first metal underlayer 434 and first conductive layer 436, respectively, and therefore, details regarding their formation, i.e., thickness, materials, temperature, and so forth, will not be repeated herein.

Figure 1D:
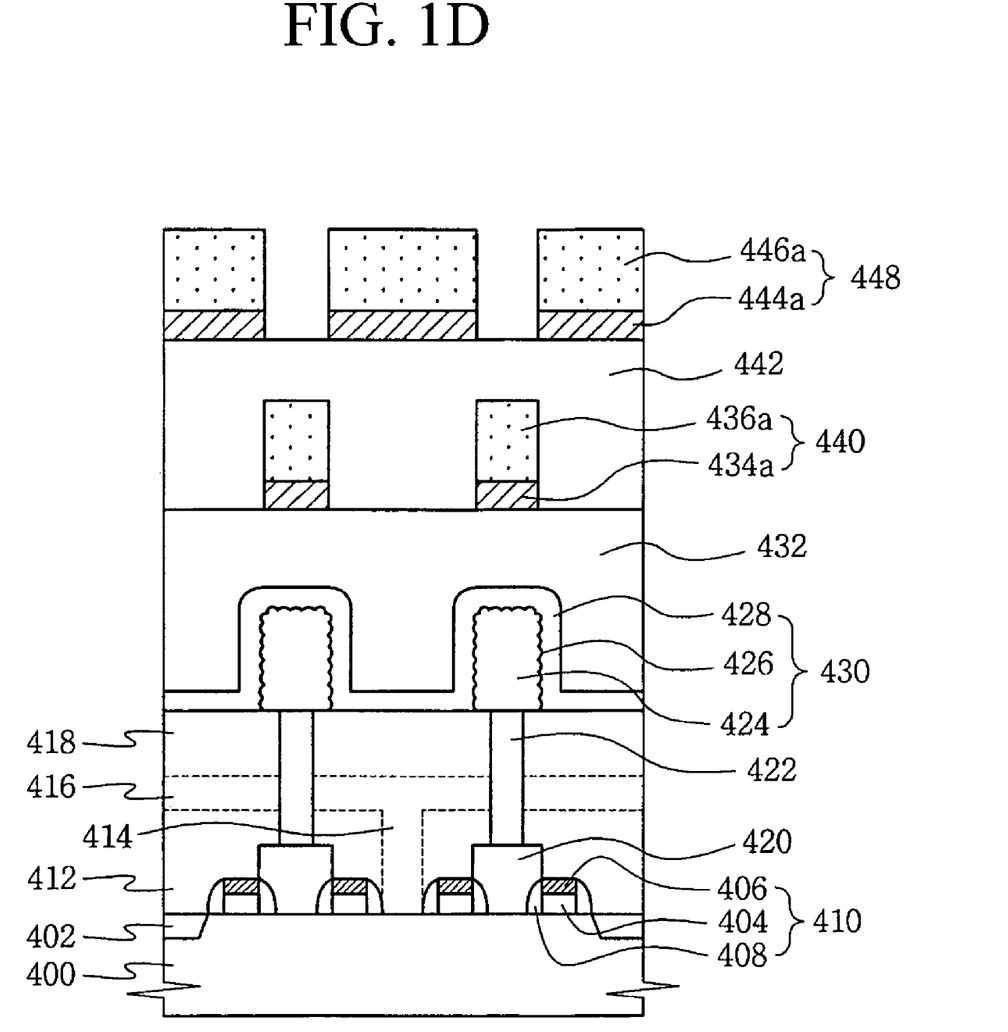

Once the second conductive layer 446 and the second metal underlayer 444 are deposited, a plasma etching process may be performed on the second metal underlayer 444 and the second conductive layer 446 to form a second metal pattern 444a and a second conductive pattern 446a, such that an upper metal wiring 448 may be formed, as illustrated in FIG. 1D. The lower and upper metal wirings 440 and 448 may be connected to each other through a via contact of, e.g., tungsten.

Formation of lower and upper metal wirings of a semiconductor memory device according to an exemplary embodiment of the present invention may be advantageous in minimizing an upper surface roughness, i.e., reducing height variations on the surface on the first and second conductive layers 436 and 446. More specifically, the surface roughness of the first and second conductive layers 436 and 446 may be minimized by employing titanium as a metal underlayer, maintaining the semiconductor substrate 400 at a temperature of about 20° C. to about 100° C., and/or depositing the first and second conductive layers 436 and 446 on respective metal underlayers at an atmosphere temperature of about 100° C. to about 200° C.

Figure 2:
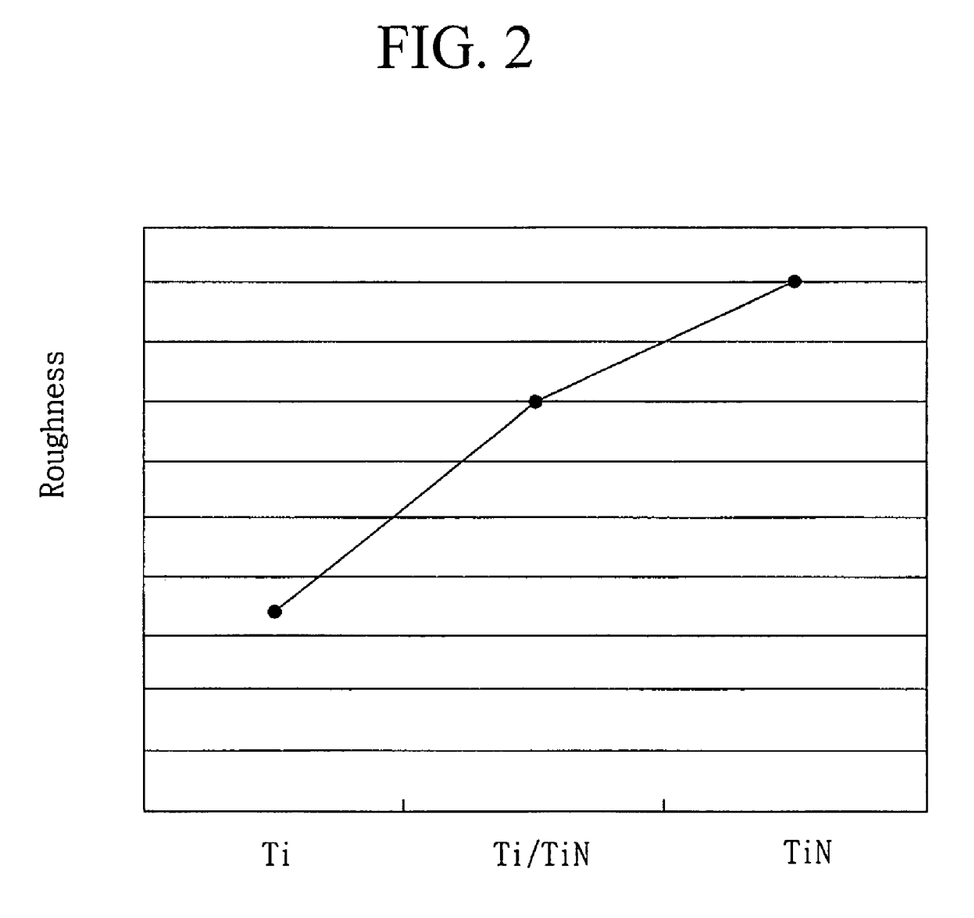
FIG. 2 illustrates a graph of a wiring surface roughness profile with respect to different materials employed in formation of the wiring.
Figure 3:
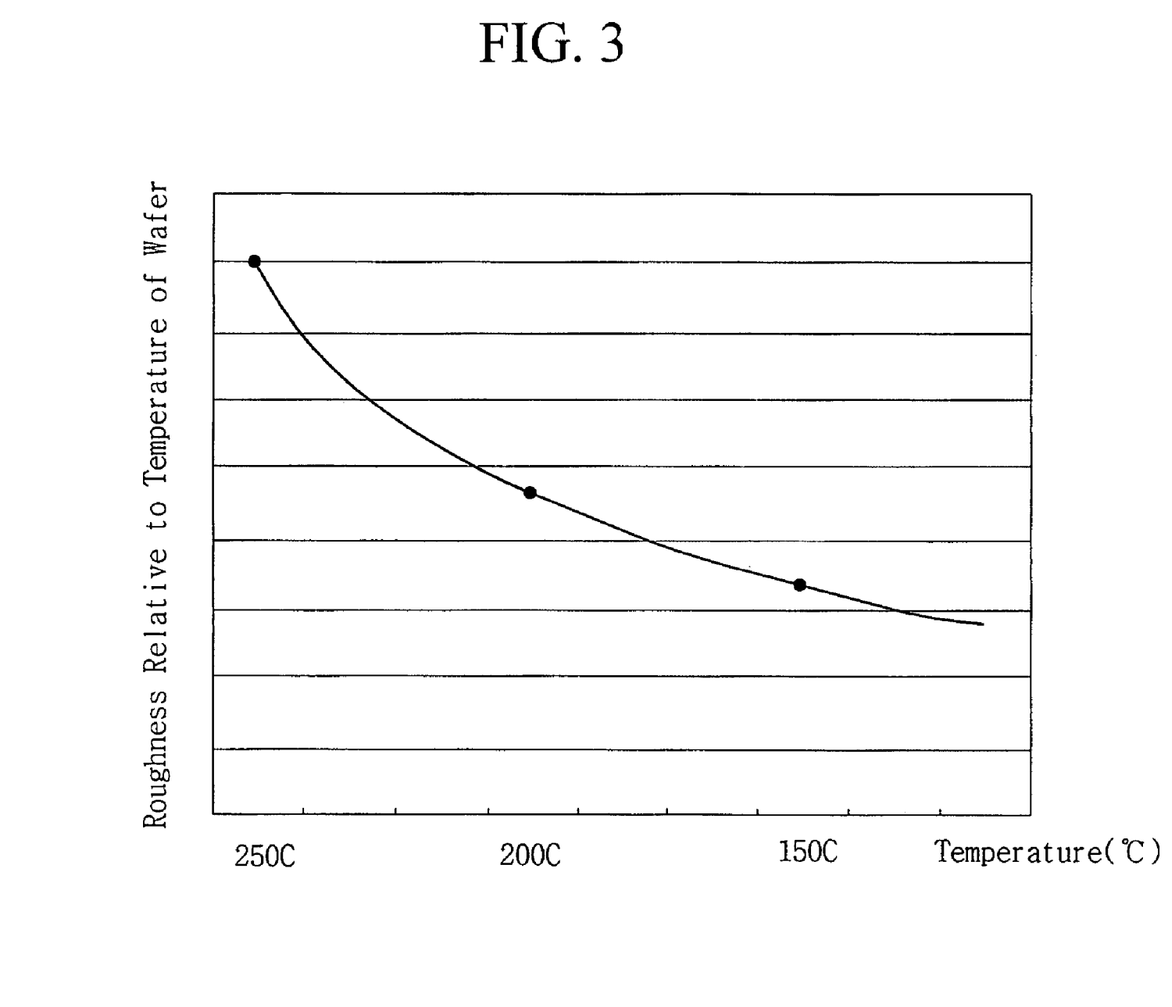
FIGS. 3-4 illustrate graphs of wiring surface roughness profiles with respect to substrate and atmosphere temperatures, respectively, employed in formation of the wiring.
Figure 4:
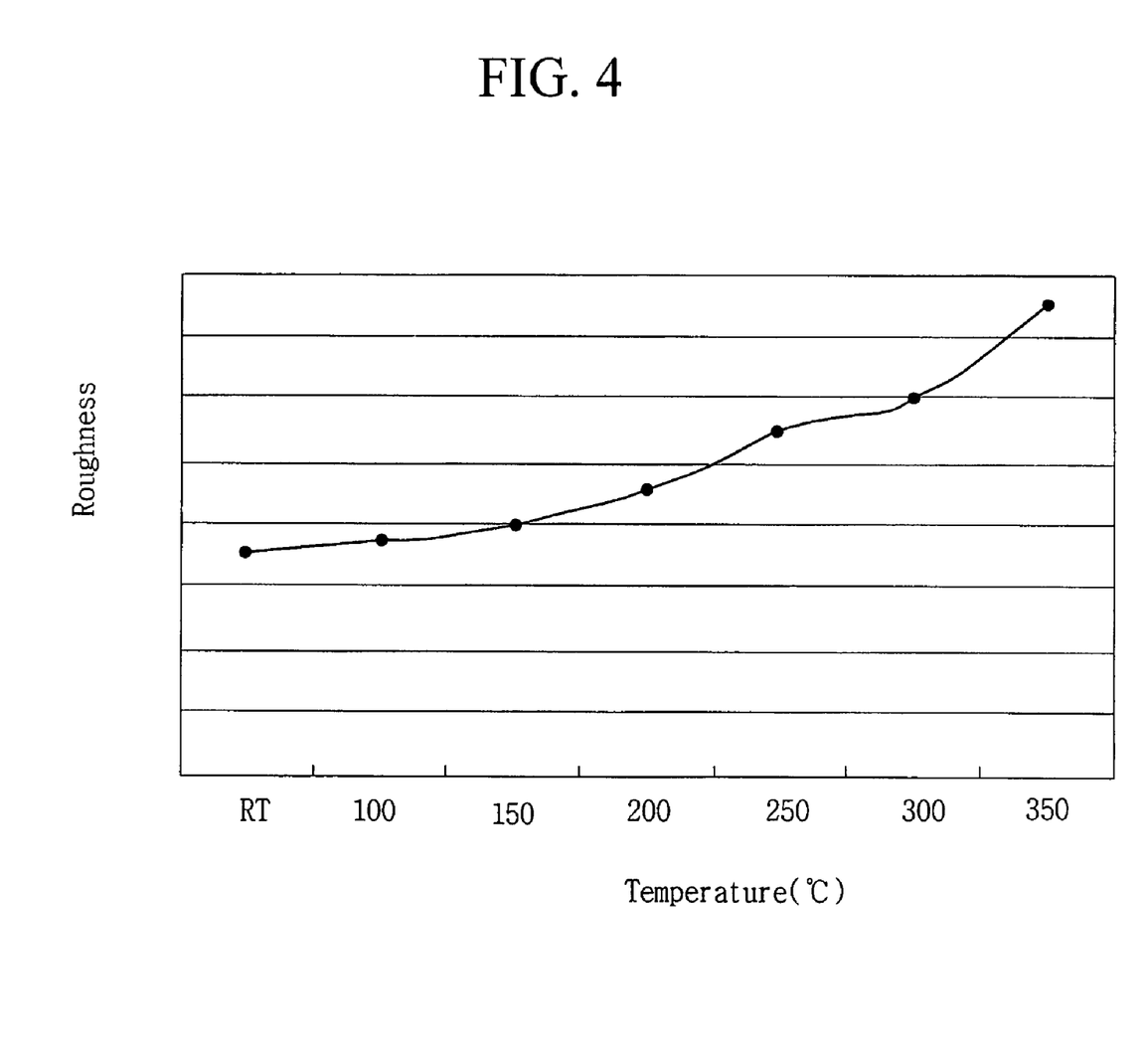
Figure 5:
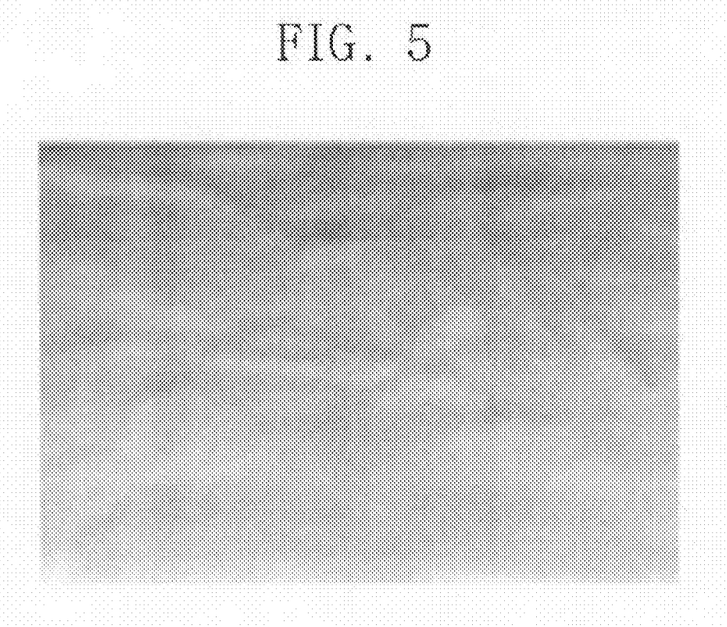
FIGS. 5-6 illustrate enlarged photographs of an aluminum wiring surface fabricated according to an embodiment of the present invention and according to a conventional method, respectively.
Figure 6:
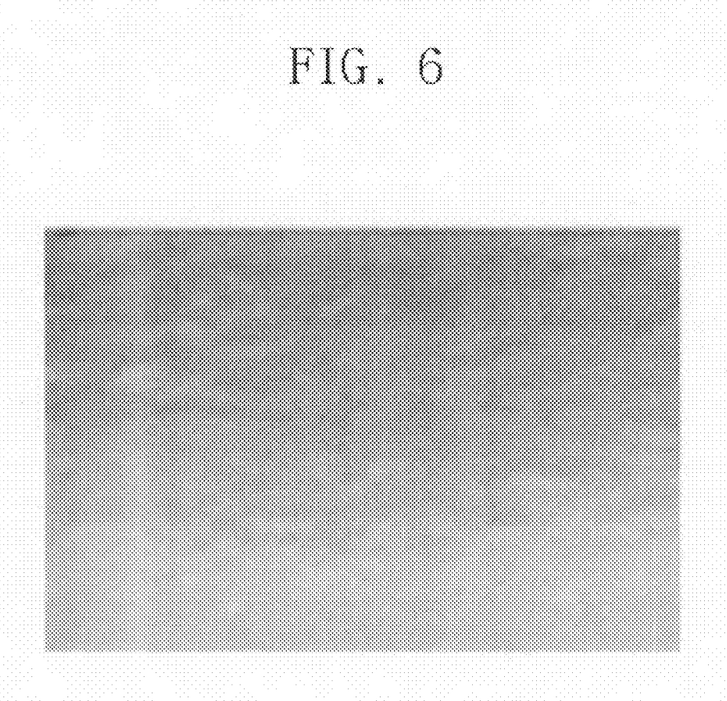

In further detail, as illustrated in the graph of FIG. 2, use of titanium to form the metal underlayer 434 or 444 may provide a lower surface roughness as compared to use of titanium/titanium nitride layer or a titanium nitride layer. Similarly, as illustrated in the graph of FIG. 3, maintaining the semiconductor memory device structure at a temperature between about room temperature, i.e., about 20° C., and about 100° C. may provide a lower aluminum surface roughness as compared to temperature above about 100° C. Additionally, as illustrated in the graph of FIG. 4, an atmosphere temperature between about 100° C. and about 200° C. during aluminum deposition may provide a lower aluminum surface roughness as compared to an atmosphere temperature of above about 200° C. A difference between an upper surface of an conductive layer formed according the conventional art, i.e., without implementing any of the conditions indicated above, as compared to a conductive layer formed according to an embodiment of the present invention is illustrated in FIGS. 5-6, respectively.

It should be noted that employing at least one of the above conditions, i.e., use of titanium, control of substrate temperature, and control of atmosphere temperature, may improve the surface roughness of the first and second conductive layers 436 and 446 according to an embodiment of the present invention. Employing more than one of the above conditions may improve the surface roughness of the first and second conductive layers 436 and 446 even further. In other words, employing any two of the above conditions may provide a lower surface roughness as compared to a surface roughness formed as a result of employing any single condition. Similarly, employing all the three above conditions may provide a lower surface roughness as compared to a surface roughness formed as a result of employing any two of the conditions.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details, such as use of semiconductor memory devices other than DRAMs and/or employing additional metal wirings, may be made without departing from the spirit and scope of the present invention as set forth in the following claims.

What is claimed is:

1. A method of forming a wiring for a semiconductor memory device, comprising:
   depositing a metal underlayer film on a semiconductor substrate having at least one circuit element, depositing the metal underlayer film including depositing titanium;
   depositing a conductive layer directly on the metal underlayer film to form a conductive layer having a substantially uniform surface profile, depositing the conductive layer including depositing aluminum; and
   patterning the metal underlayer film and the conductive layer to form a wiring,
   wherein depositing the metal underlayer film includes depositing titanium to a thickness sufficient to prevent formation of titanium aluminide between the metal underlayer film and the conductive layer.

2. The method as claimed in claim 1, wherein depositing the titanium includes depositing titanium to a thickness of about 100 to about 150 angstroms.

3. A method of forming a wiring for a semiconductor memory device, comprising:
   depositing a metal underlayer film on a semiconductor substrate having at least one circuit element, depositing the metal underlayer film including depositing titanium;
   depositing a conductive layer directly on the metal underlayer film to form a conductive layer having a substantially uniform surface profile, depositing the conductive layer including depositing aluminum; and
   patterning the metal underlayer film and the conductive layer to form a wiring,
   wherein depositing the conductive layer on titanium includes forming an aluminum layer exhibiting lower surface roughness than a comparable aluminum layer deposited on TiN or Ti/TiN.

4. A method of forming a wiring for a semiconductor memory device, comprising:
   depositing at least one conductive layer on a semiconductor substrate having at least one circuit element in a state in which a temperature of the semiconductor substrate and an atmosphere temperature are controlled, such that the conductive layer exhibits a lower surface roughness than a comparable conductive layer deposited in a state in which a temperature of a semiconductor substrate and an atmosphere temperature are uncontrolled; and
   patterning the conductive layer to form a wiring.

5. The method as claimed in claim 4, wherein depositing the conductive layer includes depositing aluminum.

6. The method as claimed in claim 4, wherein the controlled temperature of the semiconductor substrate is within a range of about 20° C. to about 100° C.

7. The method as claimed in claim 4, wherein the controlled atmosphere temperature is within a range of about 0° C. to about 200° C.

8. The method as claimed in claim 5, wherein the controlled atmosphere temperature is within a range of about 100° C. to about 200° C.

9. The method as claimed in claim 8, further comprising depositing a metal underlayer film between the conductive layer and the semiconductor substrate, the conductive layer being directly on the metal underlayer film.

10. The method as claimed in claim 9, wherein depositing the metal underlayer film includes depositing titanium.

11. The method as claimed in claim 8, further comprising depositing a plurality of conductive layers on the semiconductor substrate.

12. The method as claimed in claim 11, further comprising depositing a plurality of metal underlayer films on the semiconductor substrate, each metal underlayer film being in communication with a respective conductive layer.

13. The method as claimed in claim 4, wherein the controlled atmosphere temperature is within a range of about 0° C. to about 200° C., and the conductive layer exhibits a lower surface roughness than a comparable conductive layer deposited at an atmosphere temperature higher than about 200° C.

* * * * *